United States Patent
Hamada

(10) Patent No.: US 7,719,919 B2
(45) Date of Patent: May 18, 2010

(54) SEMICONDUCTOR MEMORY DEVICE IN WHICH WORD LINES ARE DRIVEN FROM EITHER SIDE OF MEMORY CELL ARRAY

(75) Inventor: Makoto Hamada, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 454 days.

(21) Appl. No.: 11/688,493

(22) Filed: Mar. 20, 2007

(65) Prior Publication Data

US 2008/0310229 A1    Dec. 18, 2008

(51) Int. Cl.
*G11C 8/00* (2006.01)
(52) U.S. Cl. .............. 365/230.06; 365/185.11; 365/185.05; 365/230.03; 365/189.11
(58) Field of Classification Search ............ 365/185.11, 365/185.05, 230.03, 230.06, 189.11
See application file for complete search history.

(56) References Cited

U.S. PATENT DOCUMENTS 5,963,475 A * 10/1999 Choi et al. ............. 365/185.11
2003/0156455 A1 * 8/2003 Nakamura et al. ...... 365/185.17

FOREIGN PATENT DOCUMENTS

| JP | 11-134887 | 5/1999 |
| JP | 2005-353275 | 12/2005 |
| JP | 2006-107701 | 4/2006 |
| JP | 2006-209969 | 8/2006 |

* cited by examiner

*Primary Examiner*—Pho M Luu
*Assistant Examiner*—Tha-O Bui
(74) *Attorney, Agent, or Firm*—Oblon, Spivak, McClelland, Maier & Neustadt, L.L.P.

(57) ABSTRACT

A semiconductor memory device includes a memory cell array, a first row decoder which drives the memory cell array, and a second row decoder which drives the memory cell array. The first and second row decoders simultaneously drive the memory cell array.

19 Claims, 11 Drawing Sheets

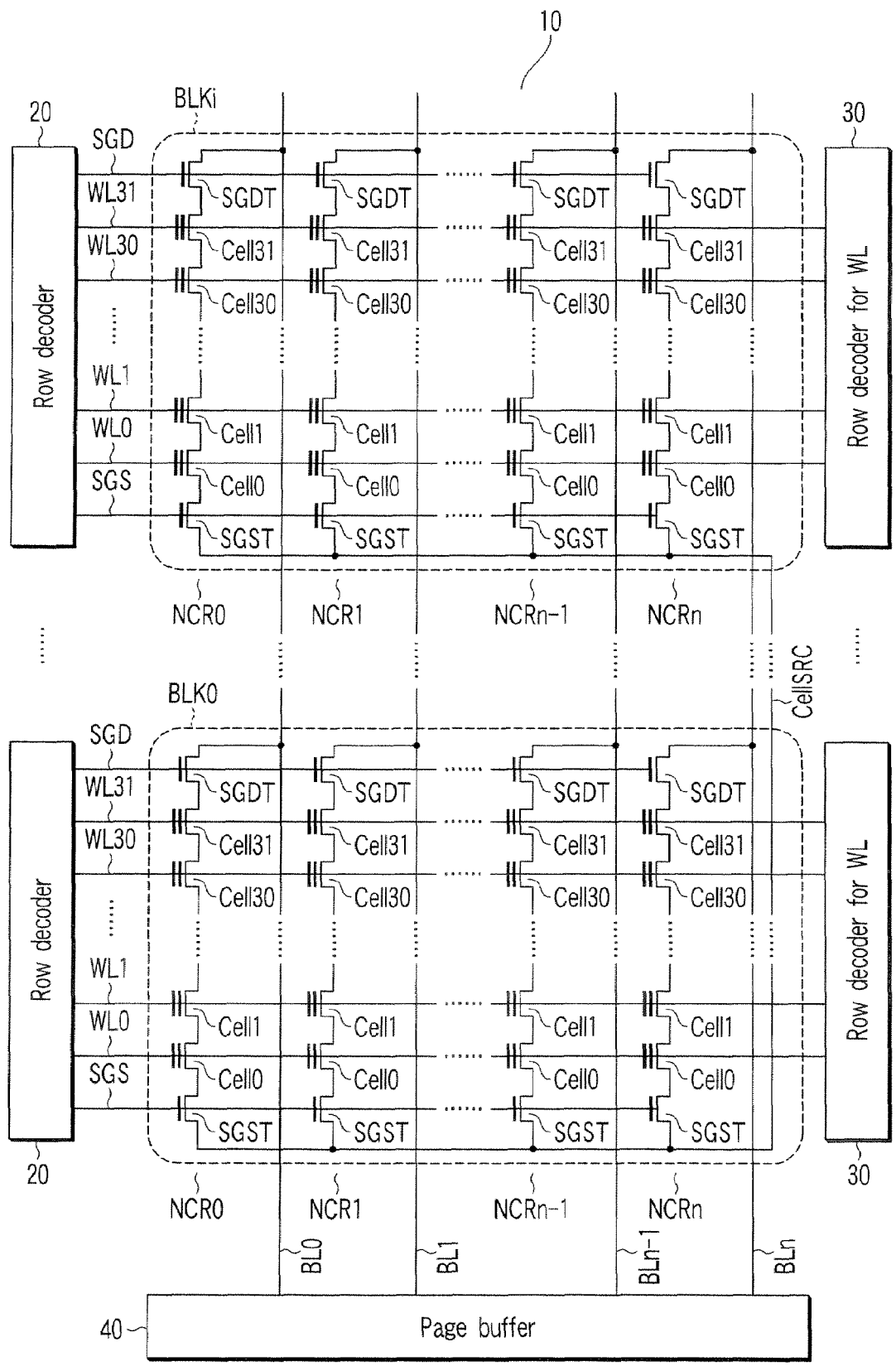
F I G. 2

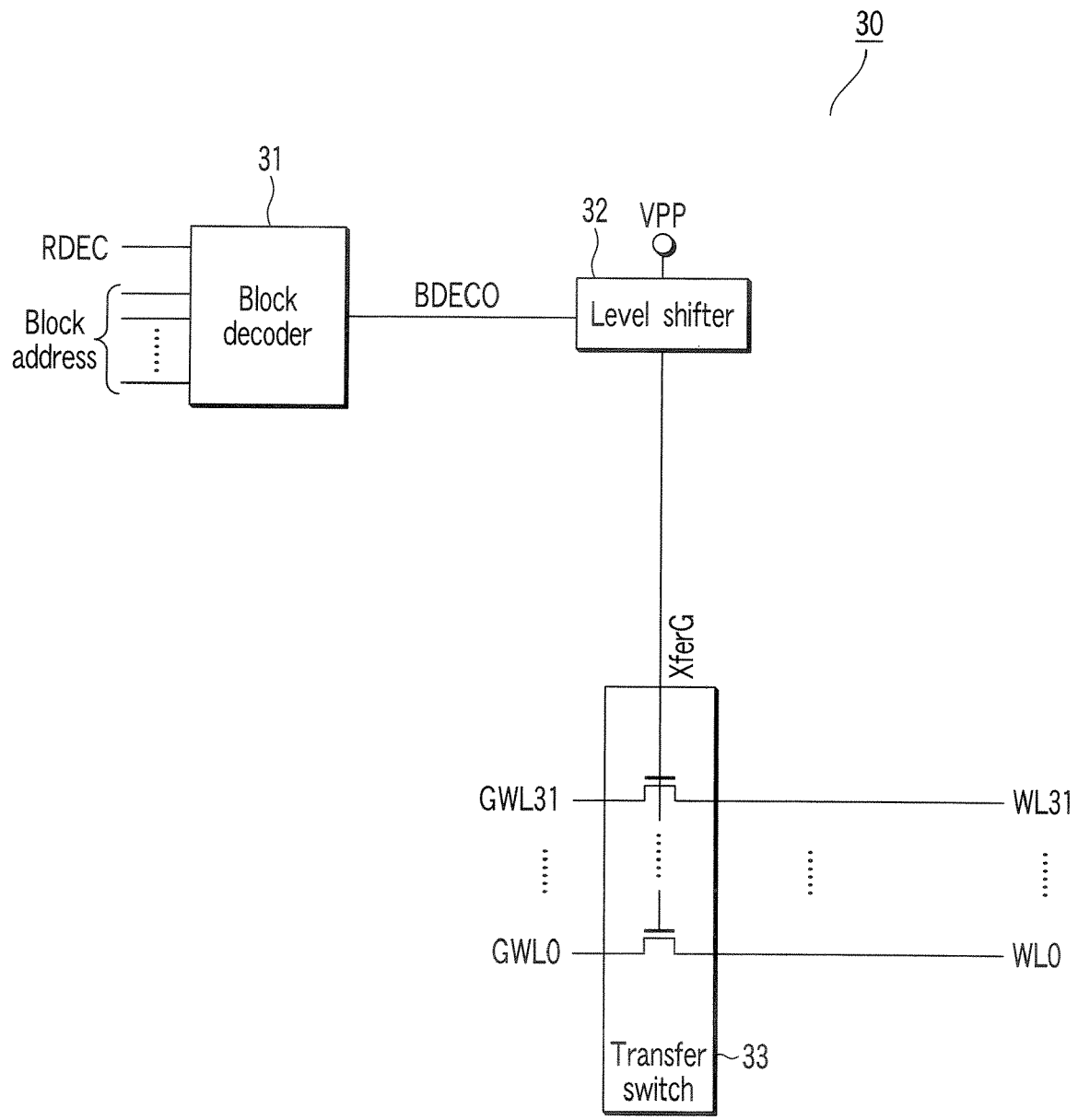
F I G. 4

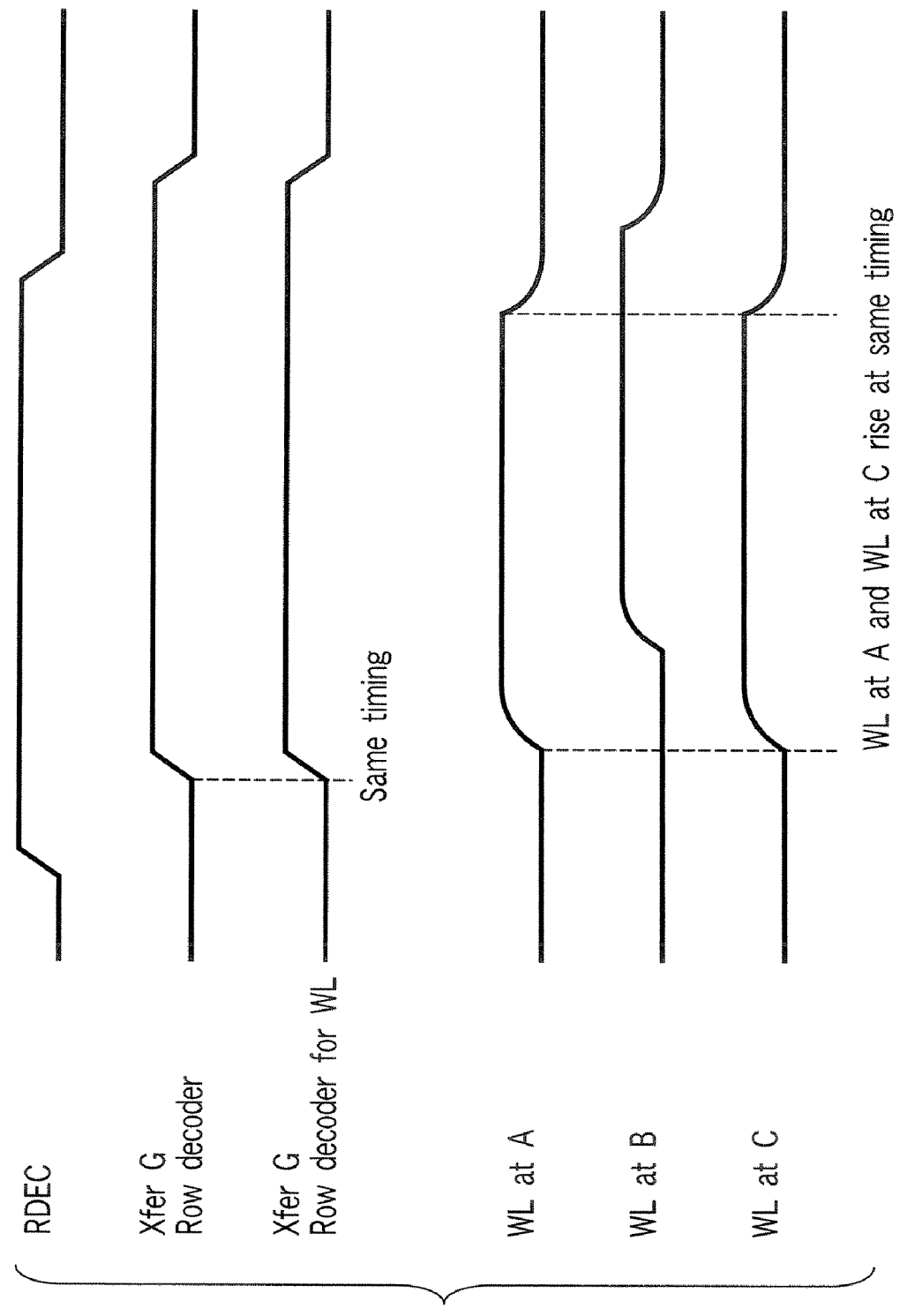
F I G. 5

SEMICONDUCTOR MEMORY DEVICE IN WHICH WORD LINES ARE DRIVEN FROM EITHER SIDE OF MEMORY CELL ARRAY

BACKGROUND OF THE INVENTION

1. Field of the Invention

This invention relates to a semiconductor memory device and more particularly to a NAND flash memory of the floating gate structure which rewrites (writes and erases) data by use of an FN tunnel current.

2. Description of the Related Art

Conventionally, the NAND flash memory is well known in the art as a nonvolatile semiconductor memory device in which data can be electrically rewritten and which is suited to be formed with high integration density and large capacity (large memory capacity) (for example, refer to Jpn. Pat. Appln. KOKAI Publication No. 2006-209969 and Jpn. Pat. Appln. KOKAI Publication No. 2005-353275).

Recently, the integration density of the NAND flash memory is further increased with the improvement of the cell structure and the progress of the fine patterning technique. Further, the high-speed operation is more strongly required with an increase in the memory capacity.

However, the width of and the distance between the word lines of the NAND flash memory become smaller with an increase in the integration density. Therefore, the resistance of the word line becomes high, the coupling capacitance between the word lines becomes large and the influence of coupling noise becomes large. As a result, access time to the memory cell array becomes long and it becomes difficult to attain the high-speed operation.

As described above, in the recent NAND flash memory, since the width of and the distance between the word lines are small, there occurs a problem that access time to the memory cell array becomes long, which means it becomes difficult to attain the high-speed operation.

BRIEF SUMMARY OF THE INVENTION

According to a first aspect of the present invention, there is provided a semiconductor memory device comprising a memory cell array; a first row decoder which drives the memory cell array; and a second row decoder which drives the memory cell array; wherein the memory cell array is simultaneously driven by the first and second row decoders.

According to a second aspect of the present invention, there is provided a semiconductor memory device comprising a memory cell array having a plurality of blocks, a plurality of cell columns being provided in the plurality of blocks and each of the plurality of cell columns having a drain-side selection transistor, a preset number of memory cells and a source-side selection transistor; a plurality of first row decoders which are arranged on one side of the memory cell array to respectively drive the plurality of blocks in the memory cell array, each of the plurality of first row decoders including a block decoder which selects a specified block in the memory cell array, a level shifter which boosts an output of the block decoder, a first transfer switch which supplies operation voltages to a drain-side control line connected to gates of the drain-side selection transistors, a source-side control line connected to gates of the source-side selection transistors and word lines connected to control gates of the preset number of memory cells in the specified block based on an output of the level shifter, and a control signal switch which controls and sets the drain-side control line and source-side control line to control signal potentials according to an inverted signal of the output of the block decoder; and a plurality of second row decoders which are arranged on the other side of the memory cell array in opposition to the plurality of first row decoders to respectively drive the plurality of blocks in the memory cell array.

According to a third aspect of the present invention, there is provided a semiconductor memory device comprising a memory cell array; a first row decoder which drives the memory cell array, the first row decoder including a block decoder which selects a specified block in the memory cell array, a level shifter which boosts an output of the block decoder, a first transfer switch which supplies operation voltages to a drain-side control line, a source-side control line and word lines in the specified block based on an output of the level shifter, and a control signal switch which controls and sets the drain-side control line and source-side control line to control signal potentials; and a second row decoder which drives the memory cell array, the second row decoder including a block decoder which selects a specified block in the memory cell array, a level shifter which boosts an output of the block decoder, and a second transfer switch which supplies operation voltages to word lines in the specified block based on an output of the level shifter.

BRIEF DESCRIPTION OF THE SEVERAL VIEWS OF THE DRAWING

FIG. 2 is a diagram showing an example of the configuration of a memory cell array of the core section shown in FIG. 1.

FIG. 4 is a diagram showing an example of the configuration of a row decoder for word lines of the core section shown in FIG. 1.

FIG. 5 is a timing chart for illustrating the word line selecting operation according to the present embodiment.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

First Embodiment

Figure 1:
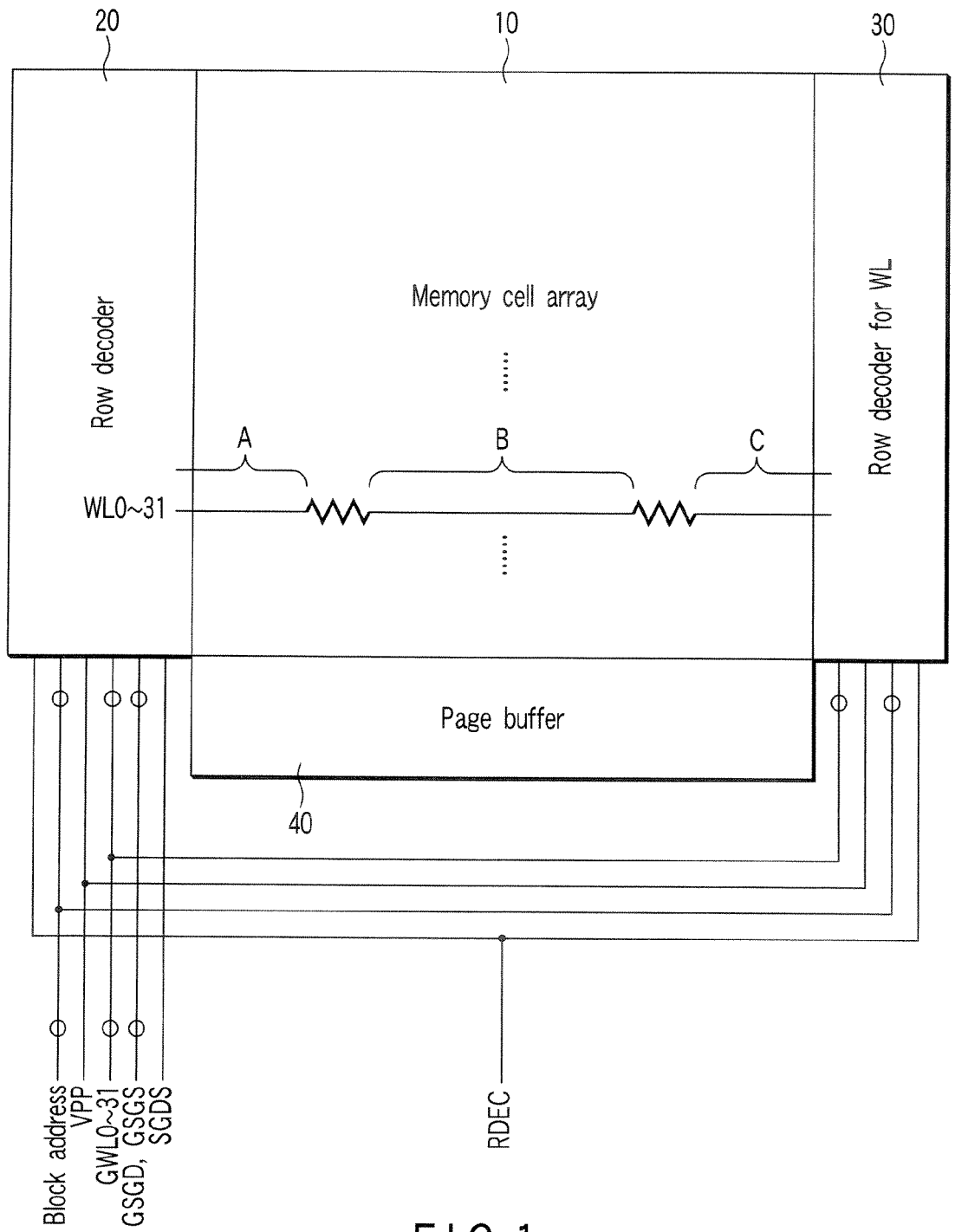
FIG. 1 is a block diagram showing an example of the configuration of a core section of a NAND flash memory according to a first embodiment of this invention.

FIG. 1 shows an example of the configuration of a core section of a semiconductor memory device according to a first embodiment of this invention. In the present embodiment, the semiconductor memory device is a nonvolatile semiconductor memory device. A case wherein a NAND flash memory having memory cells configured by MOS (Metal Oxide Semiconductor) transistors with the double (stacked) gate structure is taken as an example is explained. The NAND flash memory is a nonvolatile memory with the so-called floating gate structure in which data can be rewritten by use of an FN tunnel current.

In the case of the present embodiment, for example, as shown in FIG. 1, a row decoder 20 is arranged for each block on the left side of a memory cell array 10 and a row decoder for word lines 30 is arranged for each block on the right side thereof. That is, a plurality of blocks are provided in the memory cell array 10 and each block is selected by both of the row decoder 20 and the row decoder 30 for word lines arranged in opposition to the row decoder 20 on the other side of the memory cell array 10.

A page buffer (sense amplifier) 40 is arranged on the front side of the memory cell array 10. The operations of writing write data into the memory cell transistor and reading out readout data from the memory cell transistor are performed by use of the page buffer 40.

FIG. 2 shows the configuration of the core section shown in FIG. 1 in more detail. The memory cell array 10 includes $0^{th}$ to i-th blocks BLK. Each of the blocks BLK0 to BLKi has $0^{th}$ to n-th NAND cell columns NCR. Each of the NAND cell columns NCR0 to NCRn has a series circuit of a source-side control transistor SGST, memory cell transistors Cell0 to Cell31 and drain-side control transistor SGDT. Each of the NAND cell columns NCR0 to NCRn is connected to a corresponding one of $0^{th}$ to n-th bit lines BL and a cell source line CellSRC. That is, the sources of the source-side control transistors SGST of the NAND cell columns NCR0 to NCRn of each of the blocks BLK0 to BLKi are commonly connected to the cell source line CellSRC and each of the drains of the drain-side control transistors SGDT is connected to a corresponding one of the bit lines BL0 to BLn. The bit lines BL0 to BLn are connected to the page buffer 40.

In each of the blocks BLK0 to BLKi, the gates of the drain-side control transistors SGDT of the NAND cell columns NCR0 to NCRn are connected to a drain-side control signal line SGD and the gates of the source-side control transistors SGST are connected to a source-side control signal line SGS. The drain-side control signal line SGD and source-side control signal line SGS are connected to the row decoder 20 of a corresponding one of the blocks BLK0 to BLKi. Each of the memory cell transistors Cell0 to Cell31 is a MOS transistor with the double gate structure and has a control gate and floating gate. Each control gate is connected to a corresponding one of the word lines WL0 to WL31. In each of the memory cell transistors Cell0 to Cell31, data is rewritten by injecting or discharging charges with respect to the floating gate by use of an FN tunnel current. The word lines WL0 to WL31 are connected to the row decoder 20 and the row decoder 30 for word lines in a corresponding one of the blocks BLK0 to BLKi. That is, in the corresponding one of the blocks BLK0 to BLKi, one-side ends of the word lines WL0 to WL31 are connected to the row decoder 20 and the other ends thereof are connected to the row decoder 30 for word lines.

Figure 3:
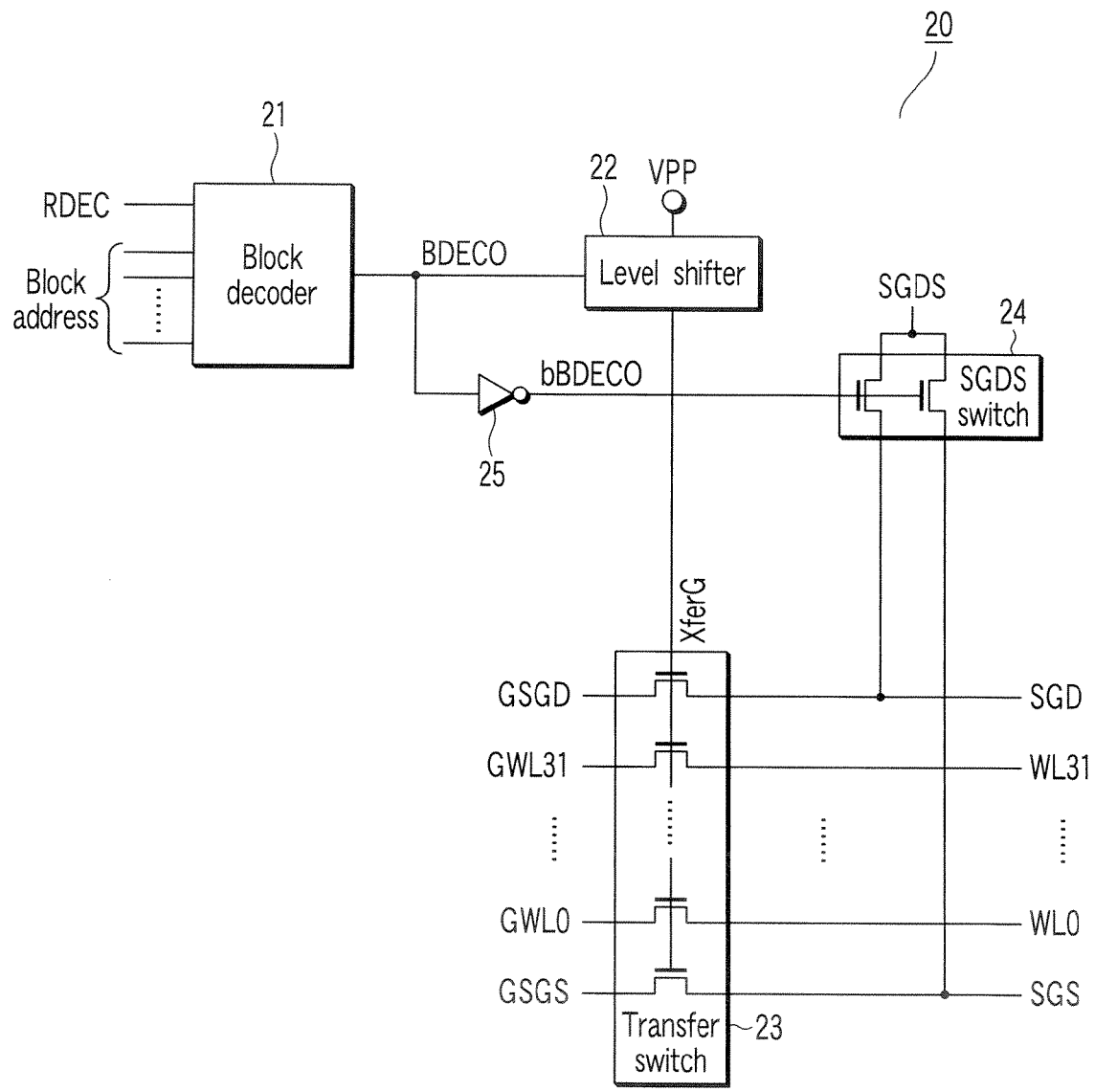
FIG. 3 is a diagram showing an example of the configuration of a row decoder of the core section shown in FIG. 1.

FIG. 3 shows an example of the configuration of the row decoder 20. The row decoder 20 includes a block decoder 21, level shifter 22, operation voltage transfer switch (Transfer switch) 23, control line potential connection switch (SGD switch) 24 and inverter 25. The operation voltage transfer switch 23 includes 34 nMOS transistors which control connection between a global drain-side control signal line GSGD and the drain-side control signal line SGD, connection between a global source-side control signal line GSGS and the source-side control signal line SGS and connections between global word lines GWL0 to GWL31 and the word lines WL0 to WL31. The control line potential connection switch 24 includes two nMOS transistors which control connection between the control gate potential signal line SGDS and the drain-side control signal line SGD and connection between the control gate potential signal line SGDS and the source-side control signal line SGS.

For example, a row decoder activating signal RDEC from a control circuit (not shown) is set to "H (high level)". Then, the block decoder 21 decodes a block address from an address circuit (not shown). In the case of the selected block, the block decoder 21 sets an output signal BDECO to "H". When the output signal BDECO is set to "H", a switch control signal bBDECO is set to "L (low level)" by the inverter 25. As a result, the control line potential connection switch 24 is set in the OFF state to break the connection between the control gate potential signal line SGDS and the drain-side control signal line SGD and the connection between the control gate potential signal line SGDS and the source-side control signal line SGS. At this time, the level shifter 22 sets a gate potential control signal line XferG to "H" in response to the output signal BDECO which is set at "H" and boosts the potential for the operation voltage transfer switch 23 until the potential is set to a level (Vpp (transfer gate potential)) which permits the operation voltage transfer switch 23 to sufficiently transfer the potentials. Thus, the operation voltage transfer switch 23 respectively transfers the potential of the global drain-side control signal line GSGD to the drain-side control signal line SGD, the potentials of the global word lines GWL0 to GWL31 to the word lines WL0 to WL31 and the potential of the global source-side control signal line GSGS to the source-side control signal line SGS.

On the other hand, in the case of the non-selected block, the block decoder 21 holds the output signal BDECO at "L". When the output signal BDECO is set at "L", the level shifter 22 sets the gate potential control signal line XferG to "L". As a result, the operation voltage transfer switch 23 is set in the OFF state to break the connection between the global drain-side control signal line GSGD and the drain-side control signal line SGD, the connections between the global word lines GWL0 to GWL31 and the word lines WL0 to WL31 and the connection between the global source-side control signal line GSGS and the source-side control signal line SGS. At this time, the inverter 25 sets the switch control signal bBDECO to "H" to set the control line potential connection switch 24 into the ON state. Thus, the control line potential connection switch 24 makes the connection between the control gate potential signal line SGDS and the drain-side control signal line SGD and the connection between the control gate potential signal line SGDS and the source-side control signal line SGS.

FIG. 4 shows an example of the configuration of the row decoder 30 for word lines. The row decoder 30 for word lines cooperates with the row decoder 20 to drive the word lines WL0 to WL31 from either side of the memory cell array 10. In the case of the present embodiment, the row decoder 30 for word lines includes a block decoder 31, level shifter 32 and operation voltage transfer switch (Transfer switch) 33. The operation voltage transfer switch 33 includes 32 nMOS transistors which control connections between the global word lines GWL0 to GWL31 and the word lines WL0 to WL31.

For example, a row decoder activation signal RDEC from the control circuit is set to "H". Then, the block decoder 31 decodes a block address from an address circuit (not shown). In the case of the selected block, the block decoder 31 sets an output signal BDECO to "H". The level shifter 32 sets the gate potential control signal line XferG to "H" in response to the output signal BDECO which is set at "H" and boosts the potential for the operation voltage transfer switch 33 until the potential is set to a level (Vpp (transfer gate potential)) which permits the operation voltage transfer switch 33 to sufficiently transfer the potentials. Thus, the operation voltage transfer switch 33 transfers the potentials of the global word lines GWL0 to GWL31 to the word lines WL0 to WL31.

On the other hand, in the case of the non-selected block, the block decoder 31 holds the output signal BDECO at "L". In the case where the output signal BDECO is set at "L", the level shifter 32 sets the gate potential control signal line XferG to "L". As a result, the operation voltage transfer switch 33 is set into the OFF state and breaks connections between the global word lines GWL0 to GWL31 and the word lines WL0 to WL31.

In the case of the present embodiment, the row decoder 30 for word lines is different from the row decoder 20 in that the control line potential connection switch and inverter are not provided. Further, the operation voltage transfer switch 33 is not configured to transfer potential of the global drain-side control signal line GSGD to the drain-side control signal line SGD or transfer potential of the global source-side control signal line GSGS to the source-side control signal line SGS. That is, the row decoder 30 for word lines is configured to have only the control function for the word lines WL0 to WL31 without having the control function for the drain-side control signal line SGD and source-side control signal line SGS.

With the above configuration, for example, as shown in FIG. 1, the row decoder activation signal RDEC is supplied to the row decoder 20 and the row decoder 30 for word lines. The block address is also supplied to the row decoder 20 and the row decoder 30 for word lines. Further, the transfer gate potential VPP is supplied to the row decoder 20 and the row decoder 30 for word lines. The potentials of the global word lines GWL0 to GWL31 are supplied to the row decoder 20 and the row decoder 30 for word lines. The potentials of the control gate potential signal line SGDS, global drain-side control signal line GSGD and global source-side control signal line GSGS are supplied only to the row decoder 20. The control gate potential VPP and the potentials of the control gate potential signal line SGDS, global drain-side control signal line GSGD and global source-side control signal line GSGS are supplied from a core control drive circuit (not shown).

According to the configuration of the present embodiment, in each of the blocks BLK0 to BLKi, the word lines WL0 to WL31 can be driven by the row decoder 20 and the row decoder 30 for word lines from either side of the memory cell array 10. That is, for example, as shown in FIG. 1, it is supposed that the word lines WL0 to WL31 of each of the blocks BLK0 to BLKi are divided into ranges A to C. Then, for example, as shown in FIG. 5, all of the word lines WL0 to WL31 at least in the ranges A and C can be substantially simultaneously activated. Therefore, the transition time of the potentials of the word lines WL0 to WL31 can be shortened, and the access to the memory cell array 10 can be made at high speed.

Particularly, the control function for the drain-side control signal line SGD and source-side control signal line SGS is not provided in the row decoder for word lines and the drain-side control signal line SGD and source-side control signal line SGS are controlled only by the row decoder 20. As a result, through paths of the control gate potential signal line SGDS—drain-side control signal line SGD—global drain-side control signal line GSGD and the control gate potential signal line SGDS—source-side control signal line SGS—global source-side control signal line GSGS can be prevented from being formed due to a difference (skew) in the propagation delay time of the row decoder activation signal RDEC.

Further, the layout area of the row decoder 30 for word lines can be reduced because the control function for the drain-side control signal line SGD and source-side control signal line SGS is not provided.

As described above, the row decoder 20 and the row decoder 30 for word lines are arranged on both sides of the memory cell array 10 and the word lines WL0 to WL31 of each of the blocks BLK0 to BLKi can be driven from either side of the memory cell array 10. Thus, even if the width of and the distance between the word lines WL0 to WL31 become small and the resistances of the word lines WL0 to WL31 become high or the influence of coupling noise caused by an increase in the coupling capacitances between the word lines WL0 to WL31 is increased, the transition time of potentials of the word lines WL0 to WL31 can be shortened. Therefore, access time to the memory cell array 10 can be shortened and the requirement for further enhancement of the operation speed with an increase in the memory capacity can be satisfied.

Figure 6:
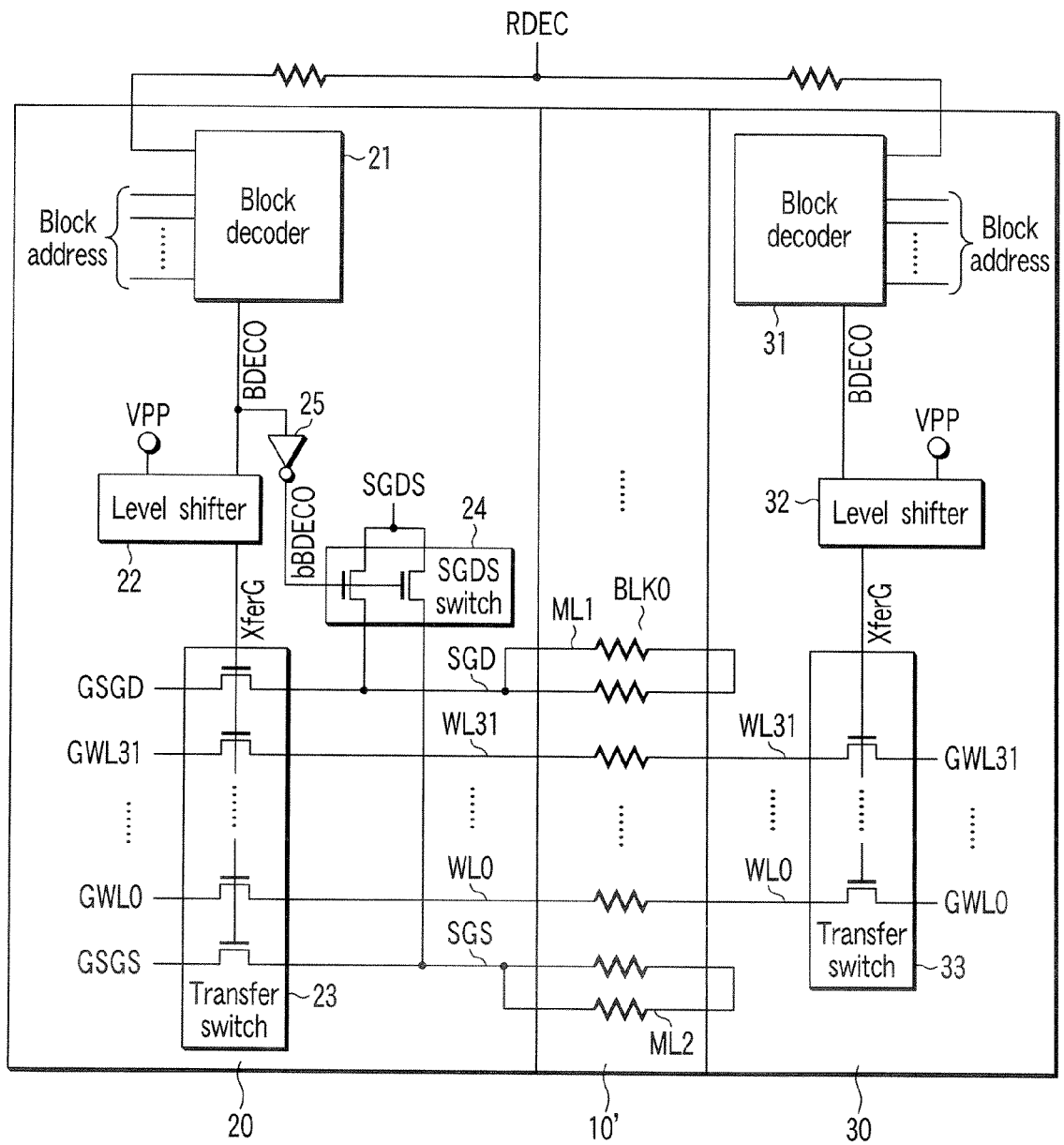
FIG. 6 is a diagram showing another example of the configuration of the core section according to the present embodiment.
Figure 7:
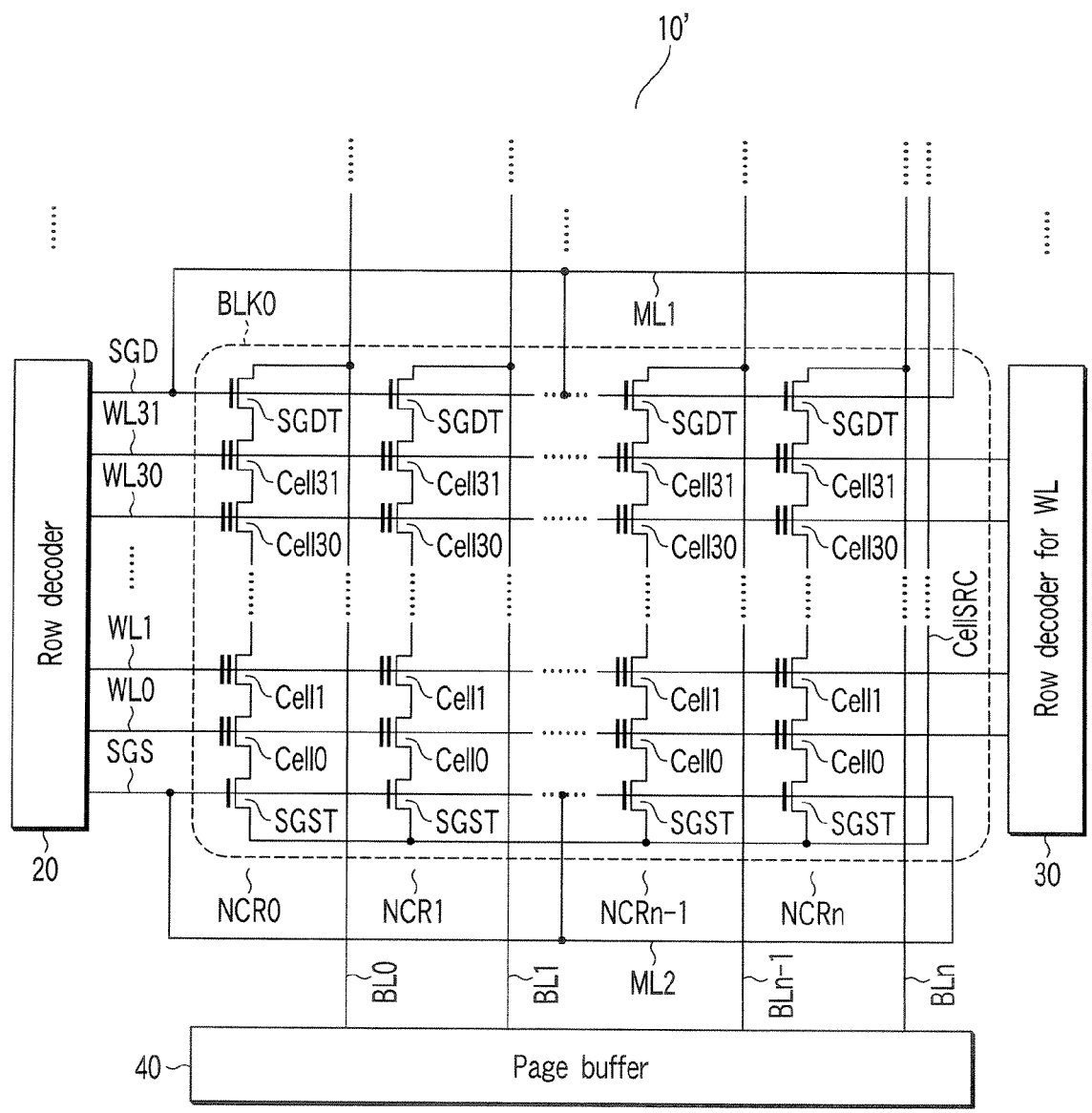
FIG. 7 is a diagram showing an example of the configuration of a memory cell array of the core section shown in FIG. 6.

FIGS. 6 and 7 show other examples of the configuration according to the present embodiment and show examples in which an attempt is made to lower the resistances of the drain-side control signal line SGD and source-side control signal line SGS. That is, the drain-side control signal line SGD of each of the blocks BLK0 to BLKi is connected in a ladder form by use of metal wirings ML1 in a memory cell array 10'. Likewise, the source-side control signal line SGS is connected in a ladder form by use of metal wirings ML2 in the memory cell array 10'. The metal wirings M1, M2 may be formed to lower the resistances of the drain-side control signal line SGD and source-side control signal line SGS irrespective of the shapes thereof.

With the above configuration, the resistances of the drain-side control signal line SGD and source-side control signal line SGS can be made lower than those of the word lines WL0 to WL31. Therefore, even when the driving operations of the drain-side control signal line SGD and source-side control signal line SGS are controlled only by use of the row decoder 20, the operations can be performed at sufficiently high speed.

Second Embodiment

Figure 8:
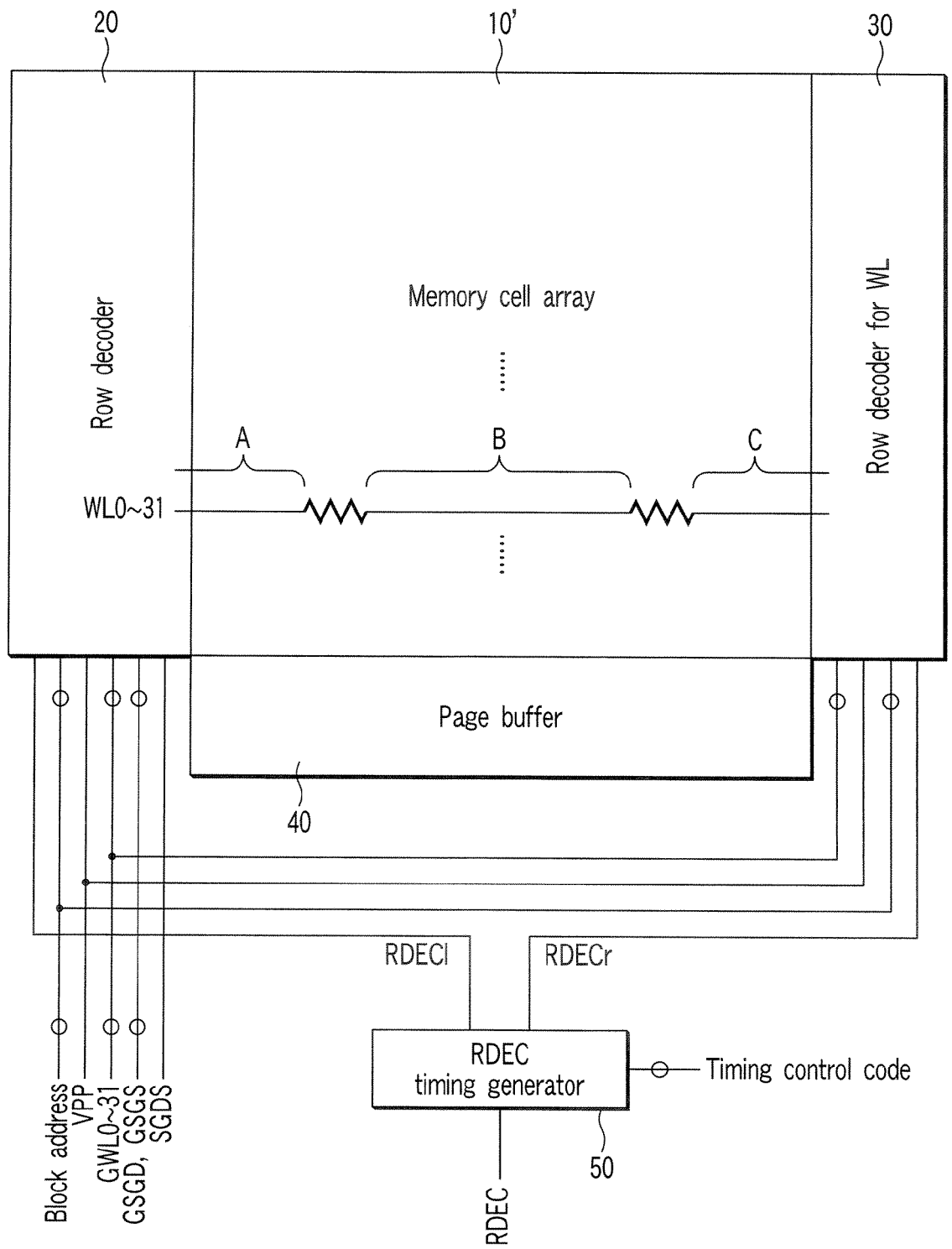
FIG. 8 is a block diagram showing an example of the configuration of a core section of a NAND flash memory according to a second embodiment of this invention.

FIG. 8 shows an example of the configuration of a core section of a semiconductor memory device according to a second embodiment of this invention. In the present embodiment, a case wherein the configuration is made to control activation timings of a row decoder 20 and a row decoder 30 for word lines is explained by taking a NAND flash memory which is a nonvolatile semiconductor memory device as an example. In the present embodiment, portions which are the same as those of the NAND flash memory explained in the first embodiment are denoted by the same reference symbols and a detailed explanation thereof is omitted.

The present embodiment is different from the first embodiment in that an RDEC timing generator 50 is newly provided. That is, a row decoder 20 is arranged for each of blocks BLK0 to BLKi on the left side of a memory cell array 10', and a row decoder 30 for word lines is arranged for each of the blocks BLK0 to BLKi on the right side. A block address is supplied to the row decoder 20 and the row decoder 30 for word lines. Transfer gate potential VPP is supplied to the row decoder 20 and the row decoder 30 for word lines. Potentials of global word lines GWL0 to GWL31 are supplied to the row decoder 20 and the row decoder 30 for word lines. Thus, each of the blocks BLK0 to BLKi in the memory cell array 10' is selected by both of the row decoder 20 and the row decoder 30 for word lines. Further, potentials of a control gate potential signal line SGDS, global drain-side control signal line GSGD and global source-side control signal line GSGS are supplied only to the row decoder 20.

A row decoder activation signal RDEC is input to the RDEC timing generator 50. The RDEC timing generator 50 is also supplied with an input timing adjusting code from a control circuit. The RDEC timing generator 50 adjusts the timing of the row decoder activation signal RDEC according to the input timing adjusting code to generate a row decoder activation signal RDECl and row decoder activation signal RDECr. The row decoder activation signal RDECl thus generated is supplied to the row decoder 20. Further, the row decoder activation signal RDECr thus generated is supplied to the row decoder 30 for word lines.

A page buffer (sense amplifier) 40 is arranged on the front side of the memory cell array 10'. The operations of writing write data into memory cell transistors Cell0 to Cell31 and reading out readout data from the memory cell transistors Cell0 to Cell31 are performed by use of the page buffer 40.

According to the configuration of the present embodiment, timings of the row decoder activation signal RDECl for the row decoder 20 and the row decoder activation signal RDECr for the row decoder 30 for word lines can be easily changed by use of the RDEC timing generator 50. Thus, the row decoder 20 and the row decoder 30 for word lines can be controlled so as to cause activation and deactivation to simultaneously occur while the signal propagation delays of the row decoder activation signal RDECl and row decoder activation signal RDECr are taken into consideration. Therefore, the word lines WL0 to WL31 of each of the blocks BLK0 to BLKi can be simultaneously driven from either side of the memory cell array 10'. As a result, the transition time of potentials of the word lines WL0 to WL31 can be shortened and access to the memory cell array 10' can be made at high speed.

Figure 9:
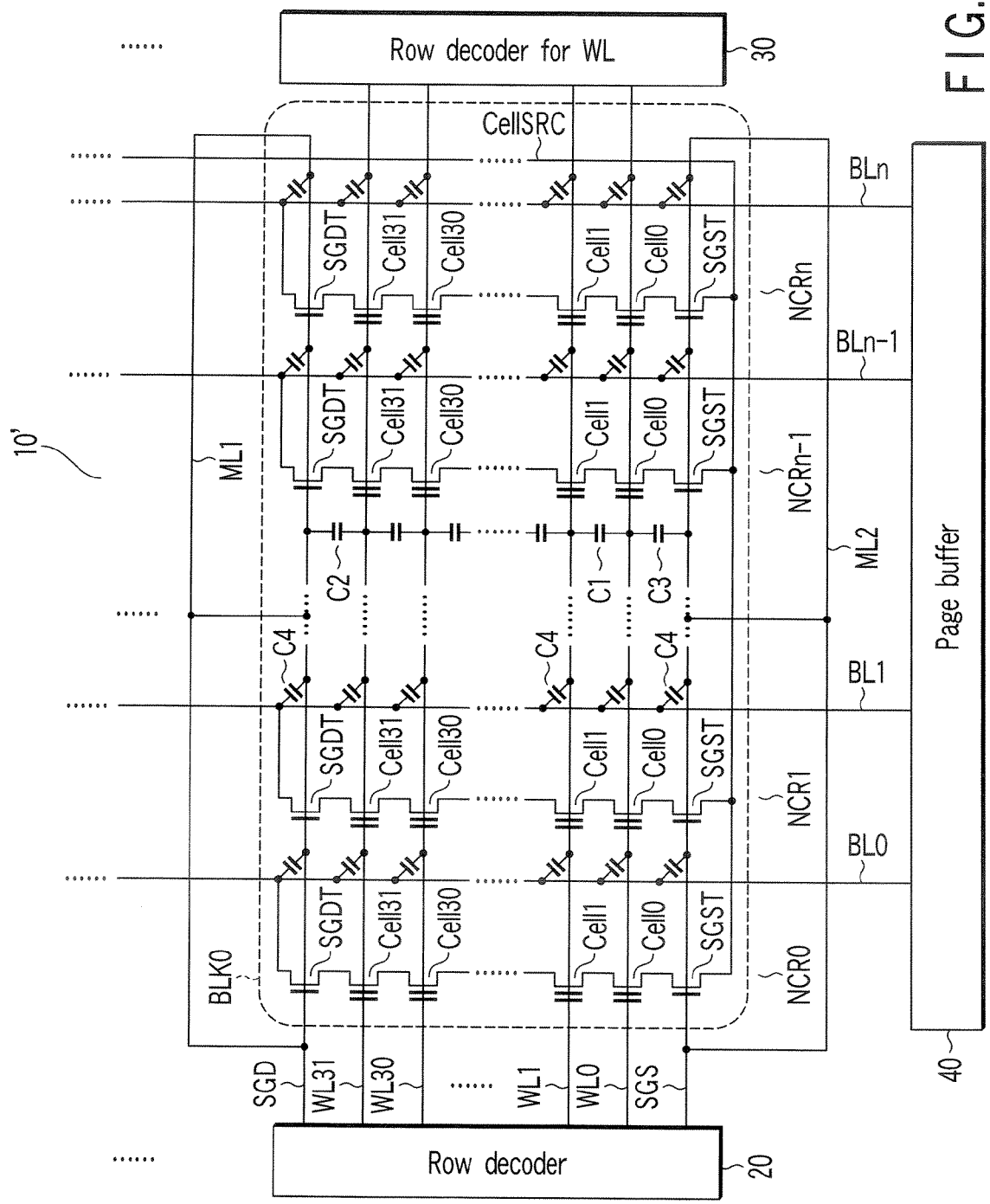
FIG. 9 is a diagram showing an example of the configuration of a memory cell array of the core section shown in FIG. 8.
Figure 10:
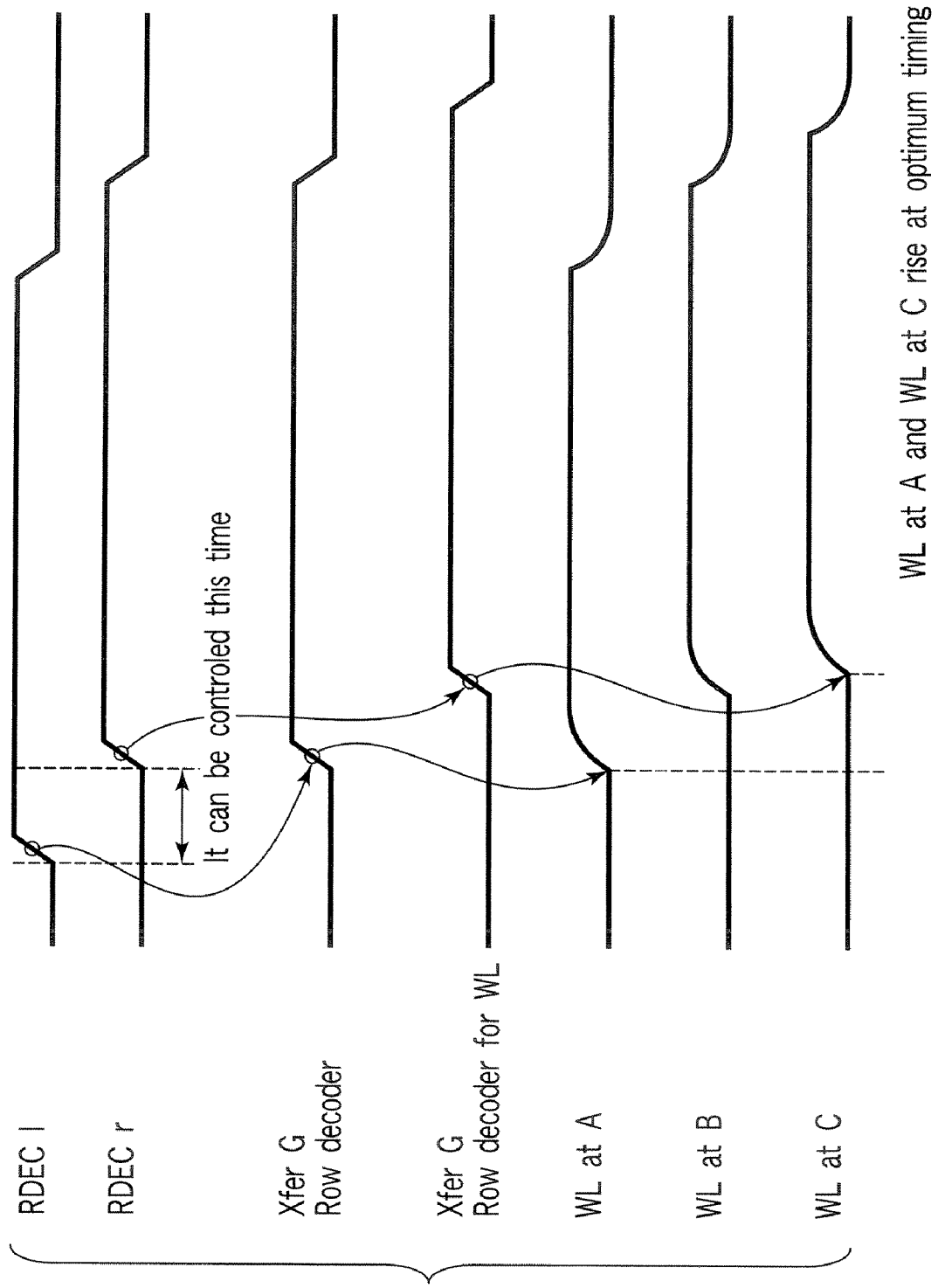
FIG. 10 is a timing chart for illustrating the word line selecting operation according to the present embodiment.

Further, the RDEC timing generator 50 can be designed to shift timings of activation and deactivation of the row decoder 20 and the row decoder 30 for word lines. That is, the transition time of the potentials of the word lines WL0 to WL31 can be changed as required by shifting the timings of the row decoder activation signal RDECl and row decoder activation signal RDECr. Generally, for example, as shown in FIG. 9, WL-WL capacitances C1, WL-SGD capacitance C2, WL-SGS capacitance C3 and WL, SGD, SGS-BL capacitances C4 exist in the memory cell array 10'. Therefore, coupling noise tends to occur due to transition of the potentials of the word lines WL0 to WL31. Thus, for example, as shown in FIG. 10, changing of the transition time of the potentials of the word lines WL0 to WL31 indicates that transition time which is optimum for the operation can be set while suppressing an influence of the coupling noise caused by transition of the word line potentials.

As described above, with the configuration of the present embodiment, the transition time of the potentials of the word lines WL0 to WL31 can be shortened, access to the memory cell array 10' can be made at high speed and word line potential transition time which is optimum for the operation can be set.

In the present embodiment, a case wherein this invention is applied to the memory cell array 10' with the configuration shown in FIG. 7 is explained as an example, but this invention is not limited to this case. For example, this invention can also be applied to the memory cell array 10 with the configuration shown in FIG. 2.

Third Embodiment

Figure 11:
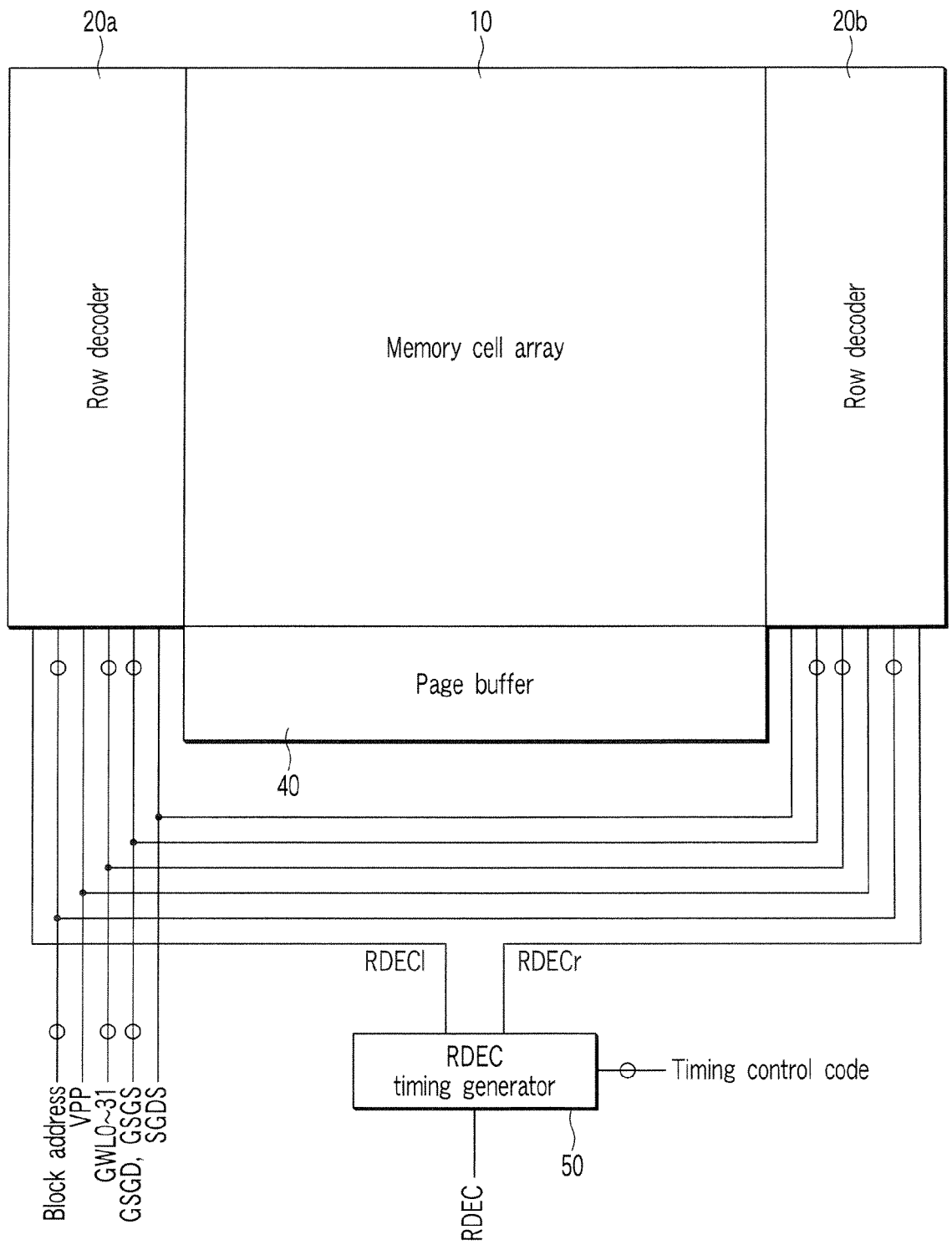
FIG. 11 is a block diagram showing an example of the configuration of a core section of a NAND flash memory according to a third embodiment of this invention.

FIG. 11 shows an example of the configuration of a core section of a semiconductor memory device according to a third embodiment of this invention. In the present embodiment, a case wherein a NAND flash memory which is a nonvolatile semiconductor memory device is taken as an example and configured to simultaneously drive word lines WL0 to WL31 of each of blocks BLK0 to BLKi from either side of a memory cell array 10 by use of row decoders 20*a*, 20*b* is explained. In the present embodiment, portions which are the same as those of the NAND flash memory explained in the first embodiment are denoted by the same reference symbols and a detailed explanation thereof is omitted.

In the case of the present embodiment, a row decoder 20*a* is arranged for each of the blocks BLK0 to BLKi on the left side of the memory cell array 10 and a row decoder 20*b* is arranged for each of the blocks BLK0 to BLKi on the right side thereof. Each of the row decoders 20*a*, 20*b* has the same configuration as that of the row decoder 20 shown in FIG. 3. A block address is supplied to the row decoders 20*a*, 20*b*. Transfer gate potential VPP is supplied to the row decoders 20*a*, 20*b*. Potentials of global word lines GWL0 to GWL31 are supplied to the row decoders 20*a*, 20*b*. Further, the potentials of a control gate potential signal line SGDS, global drain-side control signal line GSGD and global source-side control signal line GSGS are supplied to the row decoders 20*a*, 20*b*. Thus, each of the blocks BLK0 to BLKi in the memory cell array 10 is selected by both of the row decoders 20*a*, 20*b*.

A row decoder activation signal RDEC is input to an RDEC timing generator 50. Further, an input timing adjusting code from a control circuit is input to the RDEC timing generator 50. The RDEC timing generator 50 adjusts the timing of the row decoder activation signal RDEC according to the input timing adjusting code to generate a row decoder activation signal RDECl and row decoder activation signal RDECr. The row decoder activation signal RDECl thus generated is supplied to the row decoder 20*a* arranged on the left side of the memory cell array 10. Further, the row decoder activation signal RDECr thus generated is supplied to the row decoder 20*b* arranged on the right side of the memory cell array 10.

A page buffer (sense amplifier) 40 is arranged on the front side of the memory cell array 10. The operations of writing write data into memory cell transistors Cell0 to Cell31 and reading out readout data from the memory cell transistors Cell0 to Cell31 are performed by use of the page buffer 40.

According to the configuration of the present embodiment, timings of the row decoder activation signal RDECl for the row decoder 20*a* and the row decoder activation signal RDECr for the row decoder 20*b* can be easily changed by use of the RDEC timing generator 50. Thus, the row decoders 20a, 20b can be controlled so as to cause activation and deactivation to simultaneously occur while the signal propagation delays of the row decoder activation signal RDECl and row decoder activation signal RDECr are taken into consideration. Therefore, the word lines WL0 to WL31 of each of the blocks BLK0 to BLKi can be simultaneously driven from either side of the memory cell array 10 together with the drain-side control signal line SGD and source-side control signal line SGS. As a result, the transition time of the potentials of the word lines WL0 to WL31 can be shortened and access to the memory cell array 10 can be made at high speed.

Further, the RDEC timing generator 50 can be designed to set the transition time of the word lines WL0 to WL31 to a transition time which is optimum for the operation by shifting the timings of the row decoder activation signal RDECl and row decoder activation signal RDECr.

As described above, with the configuration of the present embodiment, the transition time of the potentials of the word lines WL0 to WL31 can be shortened and access to the memory cell array 10 can be made at high speed without lowering the resistances of the drain-side control signal line SGD and source-side control signal line SGS by use of metal wirings ML1, ML2.

In the first to third embodiments, a case wherein the NAND flash memory is taken as an example is explained, but this invention is not limited to this case. For example, this invention can be applied to various types of semiconductor memory devices of a system which drives word lines by use of row decoders.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array;
a first row decoder which drives the memory cell array; and
a second row decoder which drives the memory cell array;
wherein the memory cell array is simultaneously driven by the first and second row decoders, the memory cell array includes memory cells that include control gates connected to word lines, the first row decoder is connected to one-side ends of the word lines and the second row decoder is connected to the other-ends of the word lines, and the word lines are driven by the first row decoder from the one-side ends thereof and are driven by the second row decoder from the other-ends thereof.

2. The semiconductor memory device according to claim 1, wherein the first row decoder is arranged on one side of the memory cell array and the second row decoder is arranged on the other side of the memory cell array in opposition to the first row decoder.

3. The semiconductor memory device according to claim 1, wherein the first row decoder includes a block decoder which selects a specified block in the memory cell array, a level shifter which boosts an output of the block decoder, a transfer switch which supplies operation voltages to a drain-side control line, a source-side control line and word lines in the specified block based on an output of the level shifter, and a control signal switch which controls and sets the drain-side control line and source-side control line to control signal potentials.

4. The semiconductor memory device according to claim 3, wherein an operation of the control signal switch is controlled by an inverted signal of the output of the block decoder.

5. The semiconductor memory device according to claim 1, wherein the first row decoder includes a block decoder which selects a specified block in the memory cell array, a level shifter which boosts an output of the block decoder, a first transfer switch which supplies operation voltages to a drain-side control line, a source-side control line and word lines in the specified block based on an output of the level shifter, and a control signal switch which controls and sets the drain-side control line and source-side control line to control signal potentials; and the second row decoder includes a block decoder which selects a specified block in the memory cell array, a level shifter which boosts an output of the block decoder, and a second transfer switch which supplies operation voltages to the word lines in the specified block based on an output of the level shifter.

6. The semiconductor memory device according to claim 5, wherein the drain-side control line and source-side control line are respectively connected to metal wirings.

7. The semiconductor memory device according to claim 1, wherein the first row decoder includes a block decoder which selects a specified block in the memory cell array, a level shifter which boosts an output of the block decoder, a transfer switch which supplies operation voltages to a drain-side control line, source-side control line and word lines in the specified block based on an output of the level shifter, and a control signal switch which controls and sets the drain-side control line and source-side control line to control signal potentials according to an inverted signal of the output of the block decoder; and the second row decoder includes a block decoder which selects a specified block in the memory cell array, a level shifter which boosts an output of the block decoder, a transfer switch which supplies operation voltages to a drain-side control line, source-side control line and word lines in the specified block based on an output of the level shifter, and a control signal switch which controls and sets the drain-side control line and source-side control line to control signal potentials according to an inverted signal of the output of the block decoder.

8. The semiconductor memory device according to claim 1, further comprising a timing adjusting circuit which adjusts timings of activation and deactivation of the first and second row decoders.

9. The semiconductor memory device according to claim 1, wherein the memory cell array has a plurality of blocks, a plurality of cell columns are respectively provided in the plurality of blocks, each of the plurality of cell columns includes a drain-side selection transistor, a preset number of memory cells and a source-side selection transistor, and the preset number of memory cells are MOS (Metal Oxide Semiconductor) transistors with a stacked gate structure which perform data write and readout operations by use of an FN tunnel current and configure NAND cells.

10. The device according to claim 1, wherein the word lines are continuous from the first row decoder to the second row decoder.

11. A semiconductor memory device comprising:
a memory cell array having a plurality of blocks, a plurality of cell columns being provided in the plurality of blocks and each of the plurality of cell columns having a drain-side selection transistor, a preset number of memory cells and a source-side selection transistor;
a plurality of first row decoders which are arranged on one side of the memory cell array to respectively drive the plurality of blocks in the memory cell array, each of the plurality of first row decoders including a block decoder which selects a specified block in the memory cell array, a level shifter which boosts an output of the block decoder, a first transfer switch which supplies operation voltages to a drain-side control line connected to gates of the drain-side selection transistors, a source-side control line connected to gates of the source-side selection transistors and word lines connected to control gates of the preset number of memory cells in the specified block based on an output of the level shifter, and a control signal switch which controls and sets the drain-side control line and source-side control line to control signal potentials according to an inverted signal of the output of the block decoder; and a plurality of second row decoders which are arranged on the other side of the memory cell array in opposition to the plurality of first row decoders to respectively drive the plurality of blocks in the memory cell array, wherein the memory cells include control gates connected to word lines, the first row decoders are connected to one-side ends of the word lines and the second row decoders are connected to the other-ends of the word lines, and the word lines are driven by the first row decoders from the one-side ends thereof and are driven by the second row decoders from the other-ends thereof.

12. The semiconductor memory device according to claim 11, wherein the preset number of memory cells are MOS (Metal Oxide Semiconductor) transistors with a stacked gate structure which perform data write and readout operations by use of an FN tunnel current and configure NAND cells.

13. The semiconductor memory device according to claim 11, wherein each of the plurality of second row decoders includes a block decoder which selects a specified block in the memory cell array, a level shifter which boosts an output of the block decoder, and a second transfer switch which supplies operation voltages to word lines connected to control gates of the preset number of memory cells in the specified block based on an output of the level shifter.

14. The semiconductor memory device according to claim 11, wherein the drain-side control line and source-side control line are respectively connected to metal wirings.

15. The semiconductor memory device according to claim 11, wherein each of the plurality of second row decoders includes a block decoder which selects a specified block in the memory cell array, a level shifter which boosts an output of the block decoder, a first transfer switch which supplies operation voltages to a drain-side control line connected to gates of the drain-side selection transistors, a source-side control line connected to gates of the source-side selection transistors and word lines connected to control gates of the preset number of memory cells in the specified block based on an output of the level shifter, and a control signal switch which controls and sets the drain-side control line and source-side control line to control signal potentials according to an inverted signal of the output of the block decoder.

16. The semiconductor memory device according to claim 11, wherein a specified block in the memory cell array is driven by corresponding ones of the first and second row decoders.

17. The semiconductor memory device according to claim 11, wherein the plurality of first and second row decoders simultaneously drive a corresponding one of the blocks in the memory cell array.

18. The semiconductor memory device according to claim 11, further comprising a timing adjusting circuit which adjusts timings of activation and deactivation of the plurality of first and second row decoders.

19. The device according to claim 11, wherein the word lines are continuous from the first row decoders to the second row decoders.

* * * * *